US006051884A

United States Patent [19]

Papadas

[11] Patent Number: 6,051,884

[45] Date of Patent: Apr. 18, 2000

[54] METHOD OF FORMING INTERCONNECTIONS IN AN INTEGRATED CIRCUIT

[75] Inventor: Constantin Papadas, Grenoble, France

[73] Assignee: SGS-Thomson Microelectronics S.A., Gentilly, France

[21] Appl. No.: 09/118,291

[22] Filed: Jul. 17, 1998

Related U.S. Application Data

[62] Division of application No. 08/851,803, May 6, 1997, Pat. No. 5,851,919.

[30] Foreign Application Priority Data

May 7, 1996 [FR] France .................................. 96 06018

[51] Int. Cl.[7] .......................... H01L 23/48; H01L 23/52; H01L 29/40

[52] U.S. Cl. ......................... 257/774; 257/113; 257/116; 257/228; 257/257; 257/290; 257/184; 257/432; 257/437; 257/451; 257/461; 257/921; 257/394; 438/792; 438/621; 438/622; 438/635; 438/637; 438/783; 359/269; 359/273

[58] Field of Search .................................... 257/774, 113, 257/116, 228, 257, 240, 184, 432, 437, 451, 461, 921, 394; 438/792, 621, 622, 635, 637, 783; 359/269, 273

[56] References Cited

U.S. PATENT DOCUMENTS

| | | | |
|---|---|---|---|
| 3,553,533 | 1/1971 | Haberecht | 317/101 |
| 4,457,950 | 7/1984 | Fujita et al. | 427/43.1 |
| 5,459,098 | 10/1995 | Maya | 437/173 |
| 5,517,031 | 5/1996 | Wei et al. | 250/370.08 |
| 5,559,055 | 9/1996 | Chang et al. | 437/195 |
| 5,808,855 | 9/1998 | Chan et al. | 361/321.4 |

FOREIGN PATENT DOCUMENTS

| | | | |
|---|---|---|---|
| 0 072 690 | 2/1983 | European Pat. Off. | H01L 21/90 |

OTHER PUBLICATIONS

French Search Report from French Patent Application 96 0618, filed May 7, 1996.

French Search Report from French Patent Application 96 06019, filed May 7, 1996.

Solid State Communications, vol. 86, No. 10, 1993, G.B., pp 619–623, B. Pashmakov, et al., "Photoreduction and Oxidation of Amorphous Indium Oxide".

Pashmakov et al., "Photoreduction and Oxidation of Amorphous Indium Oxide," Solid State Communications, vol. 86, No. 10, pp. 619–623, Apr. 6, 1993.

*Primary Examiner*—Mahshid Saadat
*Assistant Examiner*—Matthew Warren
*Attorney, Agent, or Firm*—Wolf, Greenfield & Sacks, P.C.; James H. Morris; Theodore E. Galanthay

[57] ABSTRACT

The invention provides a method for producing wiring and contacts in an integrated circuit including the steps of forming insulated gate components on a semiconductor substrate; applying a photo-reducible dielectric layer to cover the substrate; etching holes and forming contacts; photo-reducing the dielectric to increase its conductivity; covering the resulting structure with an interconnect layer; etching the interconnect layer to define wiring in electrical contact with the contacts; and oxidizing the dielectric to reduce its conductivity.

17 Claims, 2 Drawing Sheets

METHOD OF FORMING INTERCONNECTIONS IN AN INTEGRATED CIRCUIT

This application is a divisional of application Ser. No. 08/851,803, filed May 6, 1997, now U.S. Pat. No. 5,851,919, entitled METHOD FOR FORMING INTERCONNECTIONS IN AN INTEGRATED CIRCUIT.

BACKGROUND OF THE INVENTION

1. Field of the Invention

The invention relates to methods of fabrication of integrated circuits, more particularly to etching steps required to form metallic interconnections.

2. Discussion of the Related Art

In present integrated circuit fabrication techniques, vertical connections need to be made to semiconductor devices within the integrated circuit. These are usually made by covering the semiconductor devices with an interlevel dielectric layer, such as a silicon dioxide ($SiO_2$) layer, and etching narrow, vertical holes through this dielectric layer to expose portions of the underlying device. These holes are filled with a conductive material such as tungsten, aluminum or titanium to form contacts, and an interconnect layer is applied over the surface so produced. The interconnect layer is in electrical contact with the semiconductor device, and may be patterned by etching, to define interconnect wiring.

Several conductive layers, composed of metallic materials such as tungsten, copper, aluminum, titanium, or alloys of such metals, are often used. To join together these layers, vertical connections (vias) are used.

FIG. 1 shows a cross section of a partly finished integrated circuit. A semiconductor substrate 10 of a first conductivity type contains source 15 and drain 20 regions saving a second conductivity type, opposite to the first. Lightly doped drain (LDD) structures 25 may be provided adjacent to the source 15 and drain 20 regions. A transistor gate insulator 30 lies on the semiconductor surface, between the source 15 and drain 20. A gate electrode 35 lies over the gate insulator 30. These features form a standard MOS transistor 37. A first interlevel dielectric layer 40 has been deposited over the structure. Contact holes 45, 50, 55 have been etched through the dielectric layer 40 above drain 20 gate 35 and source 15 regions, respectively. The contact holes are filled with a conductive material 60 according to any suitable process. A first interconnect layer 64 has been deposited, and patterned with an etch step to form interconnect wiring 67, 70, 75 in electrical contact with drain 20, gate 35, and source 15 regions, respectively.

The contact holes 45, 50, 55 and wiring 67, 70, 75 are usually formed by plasma etching, such as reactive ion etching (RIE). During such etch steps, significant electrical charges build up on metallic parts of the structure. When a long wiring has been formed, its entire length acts to collect charge. In a complex integrated circuit, a single wiring may attain a length of several meters.

Any charge that builds up on wirings 67, 75 may be dissipated through the diode junction formed by the substrate 10 and the drain 20 or source 15 regions, respectively. According to the polarity of the charge and the conductivity types of the source, drain and substrate, this dissipation may either be by forward bias conduction of the diode junction, or reverse bias leakage current of the same diode. The conduction is represented in the figure by arrows 77.

For charge built up on wiring 70, no such discharge path is available. The wiring is insulated from the substrate 10 by gate insulator 30. A charge builds up, illustrated in the figure by "+" signs around the gate 35, contact 60 and wiring 70, although the charge could be of either polarity. This charge causes a high voltage to be present across the gate insulator 30, causing stress and weakening that gate insulator. Such weakening will reduce the lifetime and the overvoltage immunity of the finished integrated circuit.

It has been proposed to connect a diode in parallel with the gate insulator 30, to provide a leakage path to the substrate for the charge. This however causes a leakage current during the operation of the integrated circuit.

In view of the foregoing, it is an object of the present invention to provide a method of fabricating contacts in integrated circuits which does not allow charge build up on wiring of the circuit.

It is a further object of the present invention to provide such a method which does not cause parasitic leakage current to flow from the gate during operation of a finished integrated circuit.

It is a further object of the present invention to provide such a method which does not significantly lengthen the fabrication time of integrated circuits.

SUMMARY OF THE INVENTION

Accordingly, the invention provides a method for producing wiring and contacts in an integrated circuit comprising the steps of forming an insulated gate component on a semiconductor substrate, applying a dielectric layer at least partially composed of a photo-reducible material to cover the component, etching holes in the dielectric layer to expose portions of the component, filling the holes with a conductive material to form contact plugs, photo-reducing at least an upper portion of the interlevel dielectric, prior to deposition of the interconnect layer to correspondingly increase its conductivity, covering the resulting structure with an interconnect layer, etching the interconnect layer to define the wiring, the wiring being in electrical contact with the contact plugs, and oxidizing the interlevel dielectric to reduce its conductivity.

In one embodiment of the invention, further layers of contact plugs and interconnect wiring are formed.

One embodiment of the invention includes the step of applying a passivation layer over an upper surface of the structure, the passivation layer being composed of a material opaque to light of the appropriate wavelength, to prevent accidental photo-reduction of the dielectric layers.

In one embodiment of the invention, the photo-reducible material is indium oxide, and the photo-reducing step comprises exposing the interlevel dielectric to light of wavelength shorter than 35 $\mu$m.

In an embodiment of the invention, the oxidizing step comprises exposing the dielectric layer to an ozone containing atmosphere.

In an embodiment of the invention, the ozone is produced in situ by exposing oxygen to ultraviolet light.

The present invention also provides an integrated circuit structure comprising a semiconductor substrate, an interlevel dielectric layer placed on the substrate, contact plugs provided through the dielectric layer, and wiring in electrical contact with the contact plugs, wherein the interlevel dielectric layer is comprised of a photo-reducible material in a low conductivity state.

In an embodiment of the invention, further interlevel dielectric layers are provided, each having contact plugs therethrough, and each provided with wiring in electrical contact with the contact plugs. At least some of the interlevel dielectric layers include a photo-reducible material in the low conductivity state.

In an embodiment of the invention, a surface passivation layer is provided which is opaque to light of the appropriate wavelength, thereby preventing accidental photo-reduction of the material of the dielectric layers.

BRIEF DESCRIPTION OF THE DRAWINGS

One embodiment of the present invention will be described, by way of example, with reference to the accompanying diagrams, wherein.

DETAILED DESCRIPTION

It is known that certain materials such as indium oxide may be rendered conductive by a process of photo-reduction. The materials may be rendered non-conductive again by performing a suitable oxidation step.

Stoichiometric indium oxide, $In_2O_3$, is an insulator, but photo-reduction causes oxygen vacancies and converts the indium oxide into an off-stoichiometric form, $InO_x$ ($x<1.5$), which has high conductivity.

A layer of indium oxide may be produced on a substrate by DC magnetron sputtering, using an indium target in an argon-oxygen plasma containing the substrate, although many other possible techniques exist. Such a layer may form with either an amorphous or a microcrystalline structure. Using sufficient oxygen, this layer may typically be deposited with a conductivity of around 0.1 to 1 S/m. By exposing this layer to a light source of suitable wavelength in an inert atmosphere, photo-reduction takes place. For indium oxide, ultraviolet light of wavelength less than 35 $\mu$m is effective. The conductivity of the layer then rises to approximately 100 to 1000 S/m, which is comparable to the conductivity of a metallic material. By using a reduced proportion of oxygen, the layer may be deposited in its reduced form, as oxygen vacancies will naturally exist. By then exposing the layer to an oxidizing atmosphere, the conductivity reduces to a low level, typical of stoichiometric $In_2O_3$—about $10^{-3}$ S/m.

Such oxidation may, for example, be performed in an ozone containing environment by introducing 8 kPa (600 torr) partial pressure of oxygen into a reaction chamber containing the substrate, and illuminating the chamber with the previously described ultraviolet light source. During such a step, the indium oxide layer must be shielded from direct exposure to the ultraviolet light. Oxidation takes place, filling the oxygen vacancies, and the indium oxide layer approaches its stoichiometric composition $In_2O_3$ and conductivity $10^{-3}$ S/m.

These effects are completely reversible; changes in conductivity of at least six orders of magnitude may be achieved. Crystalline indium oxide has a greater conductivity, but the lowest conductivity that can be achieved with this material is two orders of magnitude greater than that for amorphous or microcrystalline indium oxide.

Figure 1:
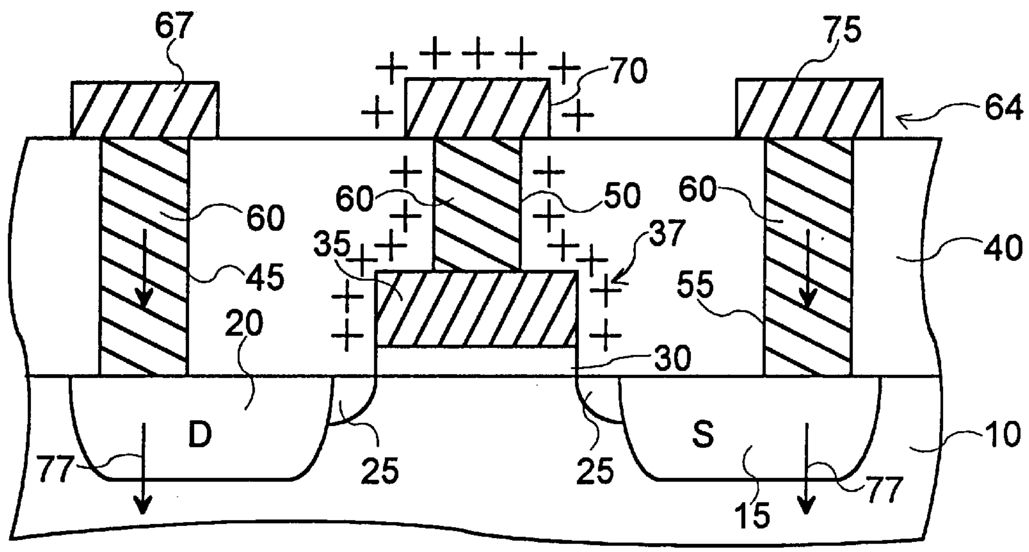
FIG. 1 shows a cross-section of a partially complete semiconductor integrated circuit structure.
Figure 2:
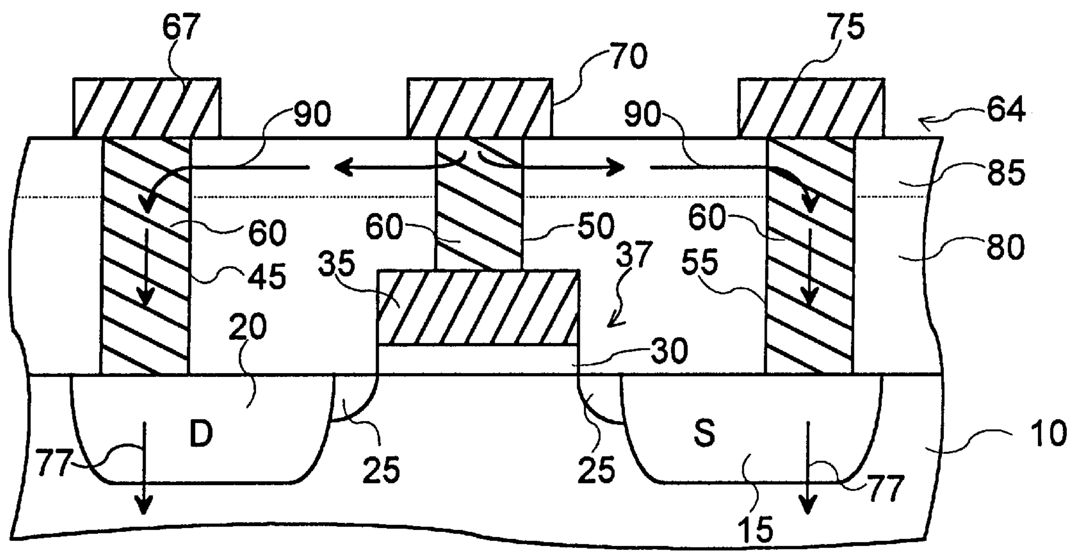
FIG. 2 shows the structure of FIG. 1 modified according to the invention.

FIG. 2 shows a cross section of a partially finished integrated circuit embodying a method of the invention. The transistor structure 37 is as defined wit respect to FIG. 1. According to an aspect of the invention, an interlevel dielectric 80 composed of a photo-reducible material such as indium oxide has been deposited. Contact holes 45, 50, 55 have been cut, and filled with a suitable metallic compound 60, to form plugged contacts.

According to the invention, this interlevel dielectric 80 is photo-reduced by exposure to light, suitable to render at least the upper surface of it conductive. If the layer 80 is composed of indium oxide, ultraviolet light having a wavelength of less than 35 $\mu$m may be used, at an intensity of 4 $W \cdot m^{-2}$. After such exposure, at least an upper portion 85 of the interlevel dielectric layer 80 becomes conductive. Interconnect layer 64 is then formed over the interlevel dielectric layer 80.

When a plasma (RIE) etching step is performed to define the wiring 67, 70, 75, any charge that may build up on the gate electrode 35, and wiring 70 is conducted through the conductive upper portion 85 of the interlevel dielectric layer 80, to source and drain contacts 55, 45. This conduction is represented in the figure by arrows 90. The source and drain contacts discharge the accumulated charge by conduction 77 through the source and drain junctions, as discussed earlier. Thus, no charge is built up on the gate electrode 35, and no risk of damage to the gate insulator 30 is caused.

After the plasma etching step is complete, the structure is exposed to the oxidizing ambient to render the interlevel dielectric 80 non-conductive once more, over its entire depth. As discussed above, this may be achieved by placing the structure in an oxygen containing atmosphere, and illuminating with the ultraviolet source already mentioned, so long as the structure itself is shielded from the ultraviolet light. This step may be performed in the same chamber as the plasma etching step.

Figure 3:
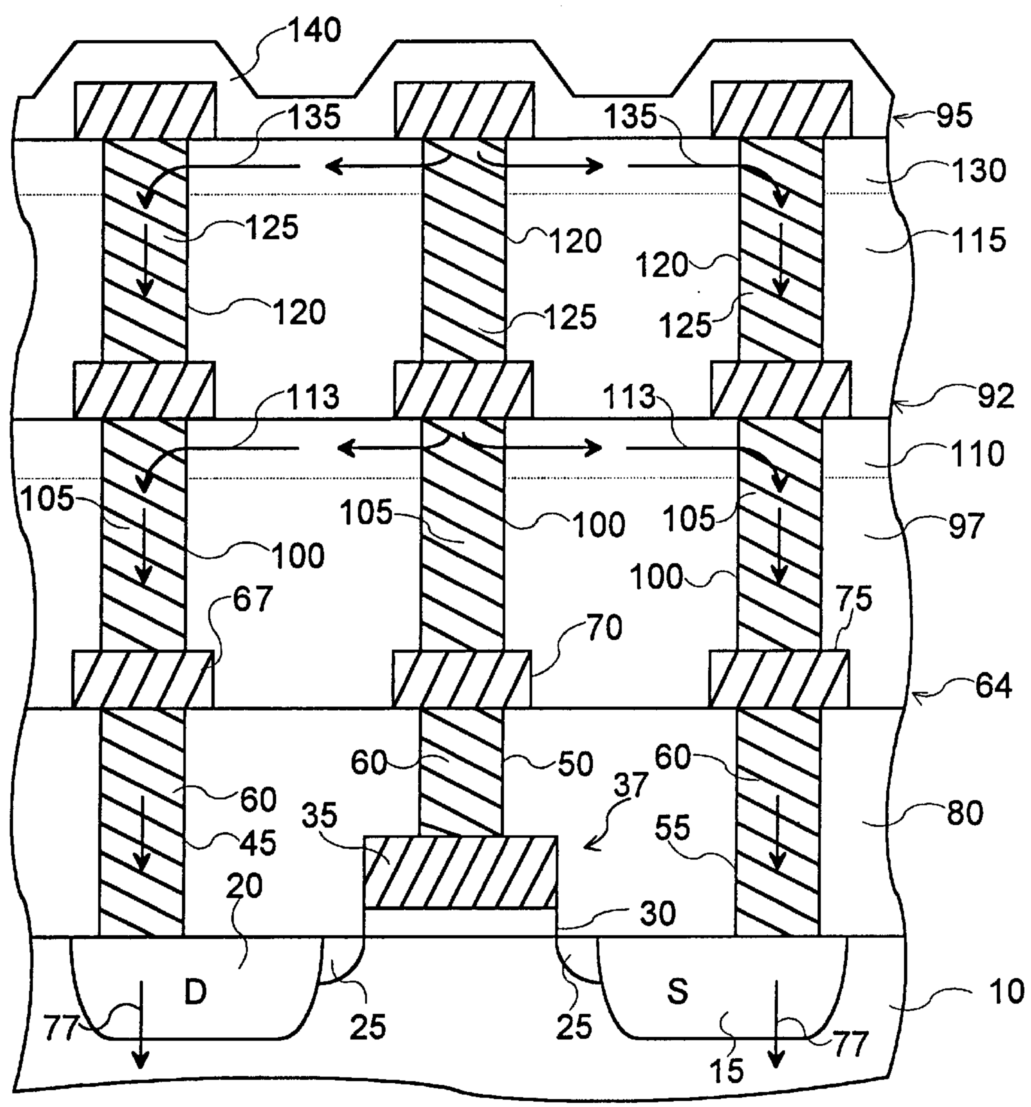
FIG. 3 shows a cross-section of a completed semiconductor integrated circuit according to the invention.

FIG. 3 shows a cross-section of a finished integrated circuit according to the method of the invention. Three layers 64, 92, 95 of interconnect are provided, although more are possible. Between first 64 and second 92 interconnect layers, a second interlevel dielectric layer 97 is formed. According to the invention, this dielectric layer is at least partially composed of photo-reducible material, such as indium oxide.

Contact holes 100 are etched in dielectric layer 97, above wiring 67, 70, 75 of the first interconnect layer 64. These holes are filled with a metallic compound 105 to form plugged vias.

The structure is subjected to photo-reduction by exposure to the ultraviolet light source in an inert atmosphere to render an upper portion 110 of second interlevel dielectric layer 97 conductive. As discussed with reference to upper portion 85 of interlevel dielectric layer 80, this conductivity allows any charges that build up on the gate electrode 35, 70 to be conducted through the upper portion 110 to source and drain contacts 45, 55, causing no damage to the gate insulator 30. This conduction is represented in the figure by arrows 113.

The structure is then subjected to oxidation, for example, by exposure to the ozone containing atmosphere already discussed to render the dielectric 97 non-conductive again over its entire depth. This may be repeated in an identical fashion with third interlevel dielectric layer 115, contact holes 120, metallic compound 125, conductive upper portion 130 of dielectric layer 115, conduction 135 and third interconnect layer 95.

At the end of processing, a passivation layer 140 is applied over the entire surface of the finished integrated circuit. According to an aspect of the invention, this passivation layer is composed of a material opaque to any light which would render dielectric layers 115, 97, 80 conductive. This prevents the dielectric layers from accidentally becoming conductive once again due to incident ultraviolet light. For an embodiment using indium oxide dielectric, and ultraviolet light of wavelength under 35 μm, a suitable passivation material is silicon nitride.

The present invention thus achieves its aims, in that charge build up on wiring of the circuit is prevented during the manufacturing of the integrated circuit; no parasitic leakage current flows during operation of the finished integrated circuit, as the dielectric is returned to a non-conductive state before circuit is finished; no lengthy process steps are added by the method of the invention. In effect, only one gas mixture operation and two, very fast, exposures to light are added beyond a normal process flow. Deposition of the photo-reducible dielectric layers of the invention takes the place of deposition of a dielectric layer 40 in known processes.

Although the invention has been described with reference to only a limited number of embodiments, many modifications will readily appear to one skilled in the art. Such modifications remain within the spirit and scope of the invention.

In particular, other materials than indium oxide may be used as a photo-reducible dielectric, such as zinc oxide, titanium oxide, and mixtures of such compounds.

Each interlevel dielectric layer may be formed from a first sub-layer of a non-photoreducible dielectric, covered in a second sub-layer of a photo-reducible dielectric.

The invention applies not only to MOS transistors, but also to all semiconductors having at least one isolated electrode, such as double gate EPROM cells.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An integrated circuit including a plurality of MOS structures each having a gate electrode located over a gate insulator, comprising a semiconductor substrate, a dielectric layer placed on the substrate, contact plugs being formed over the gate electrodes and provided through the dielectric layer, and wiring being provided in electrical contact with the contact plugs, wherein the dielectric layer that surrounds the contact plugs includes a photo-reducible material in a low conductivity state, and includes an upper portion capable of being rendered conductive when exposed to light having a wavelength shorter than 35 μm.

2. The integrated circuit of claim 1, further comprising further interlevel dielectric layers, each having contact plugs therethrough, and each provided with wiring in electrical contact with the contact plugs connected to the gate electrodes, wherein at least some of the interlevel dielectric layers include said photo-reducible material in the low conductivity state.

3. An integrated circuit according to claim 1, further comprising a surface passivation layer which is opaque to light of said wavelength suitable for photo-reduction of the photo-reducible material of the dielectric layers.

4. An integrated circuit structure comprising, a semiconductor substrate;

a dielectric layer including a photo-reducible material placed on said-substrate, said dielectric layer including an upper portion capable of being rendered conductive when exposed to light having a wavelength shorter than 35 μm;

contact plugs provided through said dielectric layer; and wiring in electrical contact with said contact plugs.

5. The integrated circuit of claim 4 wherein said circuit structure further comprises an upper surface and a passivation layer which is opaque to of said wavelength suitable for photo-reduction of the dielectric layer on said upper surface.

6. The integrated circuit of claim 4 wherein said photo-reducible material of said dielectric layer is indium oxide.

7. An integrated circuit structure comprising:

a semiconductor substrate;

a first dielectric layer on said substrate;

contact plugs provided through said first dielectric layer;

wiring provided in electrical contact with said contact plugs of said first dielectric layer;

a second dielectric layer on said first dielectric layer, said second dielectric layer including a photo-reducible material, said second dielectric layer having an upper portion being rendered conductive when exposed to light, wherein said light has a wavelength shorter than 35 μm;

contact plugs provided through said second dielectric layer; and wiring provided in electrical contact with said contact plugs of said second dielectric layer.

8. The integrated circuit structure of claim 7 further comprising a passivation layer which is opaque to said light of said wavelength.

9. The integrated circuit structure of claim 7 wherein said photo-reducible material is indium oxide.

10. The integrated circuit structure of claim 7 further comprising at least one additional dielectric layer on said second dielectric layer;

each of said at least one additional dielectric layers including a photo-reducible material;

contact plugs through each of said at least one additional dielectric layers; and wiring in electrical contact with said contact plugs of said at least one additional dielectric layer.

11. The integrated circuit structure of claim 10 further comprising a passivation layer on said at least one additional dielectric layer wherein said passivation layer is opaque to light of said wavelength suitable for photo-reduction of the dielectric layer.

12. An integrated circuit structure comprising:

a semiconductor substrate;

a first dielectric layer on said substrate;

contact plugs provided through said first dielectric layer;

wiring provided in electrical contact with said contact plugs of said first dielectric layer;

a second dielectric layer on said first dielectric layer, said second dielectric layer including a photo-reducible material;

at least one additional dielectric layer on said second dielectric layer, each of said at least one additional dielectric layers including said photo-reducible material;

said contact plugs provided through said second layer and each of said at least one additional dielectric layers;

said wiring in electrical contact with said contact plugs of said second dielectric layer and said at least one additional dielectric layer;

said second dielectric layer and each of said at least one additional dielectric layers each having an upper portion; and at least said upper portion of each respective dielectric layer being rendered conductive by exposure to light, wherein said light has a wavelength shorter than 35 μm.

13. The integrated circuit of claim 12 wherein said photo reducible material of each of said at least one additional dielectric layers and of said second dielectric layer is selected from the group consisting of indium oxide, zinc oxide, titanium oxide, and mixtures thereof.

14. The integrated circuit structure of claim 12 further comprising a passivation layer on said at least one additional dielectric layer wherein said passivation layer is opaque to light of said wavelength.

15. A layer for use in an integrated circuit comprising a dielectric layer at least partially composed of a photo-reducible material in a low conductivity state surrounding contact plugs provided in electrical contact with insulated gate structures, said photo-reducible material being rendered conductive upon irradiation in an inert atmosphere by light having a wavelength shorter than 35 μm.

16. The layer of claim 15 wherein said dielectric layer has an upper portion that is photo-reduced upon said irradiation by said light.

17. The layer of claim 15 wherein said photo-reducible material is selected from the group consisting of indium oxide, zinc oxide, titanium oxide, and mixtures thereof.

* * * * *